(12) United States Patent
Carducci et al.

(10) Patent No.: US 8,313,578 B2
(45) Date of Patent: Nov. 20, 2012

(54) ETCHING CHAMBER HAVING FLOW EQUALIZER AND LOWER LINER

(75) Inventors: James D. Carducci, Sunnyvale, CA (US); Kin Pong Lo, Fremont, CA (US); Kallol Bera, San Jose, CA (US); Michael C. Kutney, Santa Clara, CA (US); Matthew L. Miller, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 274 days.

(21) Appl. No.: 12/624,155

(22) Filed: Nov. 23, 2009

(65) Prior Publication Data

US 2010/0065213 A1 Mar. 18, 2010

Related U.S. Application Data

(63) Continuation of application No. 12/020,696, filed on Jan. 28, 2008, now abandoned.

(51) Int. Cl.
*C23C 16/52* (2006.01)
*C23C 16/455* (2006.01)

(52) U.S. Cl. ..................... 118/715; 156/345.1
(58) Field of Classification Search ............... 118/715; 156/345.1, 345.29
See application file for complete search history.

(56) References Cited

U.S. PATENT DOCUMENTS

| | | | |
|---|---|---|---|
| 5,639,334 A * | 6/1997 | Canale et al. | 156/345.51 |
| 6,095,083 A | 8/2000 | Rice et al. | |
| 6,277,237 B1 * | 8/2001 | Schoepp et al. | 156/345.1 |
| 6,527,911 B1 | 3/2003 | Yen et al. | |
| 6,626,186 B1 * | 9/2003 | Hillman et al. | 134/1.1 |
| 7,011,039 B1 * | 3/2006 | Mohn et al. | 118/723 R |
| 2001/0032591 A1 * | 10/2001 | Carducci et al. | 118/723 E |
| 2001/0054381 A1 | 12/2001 | Umotoy et al. | |
| 2003/0038111 A1 | 2/2003 | Carducci et al. | |
| 2003/0094135 A1 * | 5/2003 | Komiya et al. | 118/715 |
| 2003/0116432 A1 * | 6/2003 | Schweitzer et al. | 204/298.11 |
| 2003/0192644 A1 * | 10/2003 | Pu et al. | 156/345.28 |
| 2003/0192646 A1 | 10/2003 | Wu et al. | |
| 2004/0033385 A1 * | 2/2004 | Kaushal et al. | 428/627 |

(Continued)

FOREIGN PATENT DOCUMENTS

JP 2004-342703 * 2/2004

(Continued)

OTHER PUBLICATIONS

International Search Report and Written Opinion of the International Searching Authority mailed Oct. 14, 2009, in International Application No. PCT/US2009/030708.

(Continued)

*Primary Examiner* — Jeffrie R Lund
*Assistant Examiner* — Satish Chandra
(74) *Attorney, Agent, or Firm* — Patterson & Sheridan, LLP

(57) ABSTRACT

A plasma processing chamber having a lowered flow equalizer and a lower chamber liner. In an etching process, the processing gases may be unevenly drawn from the processing chamber which may cause an uneven etching of the substrate. By equalizing the flow of the processing gases evacuated from the chamber, a more uniform etching may occur. By electrically coupling the flow equalizer to the chamber liners, the RF return path from the flow equalizer may run along the chamber liners and hence, reduce the amount of plasma drawn below the substrate during processing.

13 Claims, 6 Drawing Sheets

U.S. PATENT DOCUMENTS

| | | |
|---|---|---|
| 2004/0129218 A1* | 7/2004 | Takahashi et al. ............ 118/715 |
| 2004/0159286 A1* | 8/2004 | Aoki et al. ................ 118/723 E |
| 2004/0206309 A1 | 10/2004 | Bera et al. |
| 2005/0121143 A1 | 6/2005 | Daugherty et al. |
| 2005/0224180 A1 | 10/2005 | Bera et al. |
| 2007/0170052 A1* | 7/2007 | Ritchie et al. ............ 204/298.12 |
| 2008/0090417 A1 | 4/2008 | De La Llera et al. |

FOREIGN PATENT DOCUMENTS

JP    2006269806 A    10/2006

OTHER PUBLICATIONS

English Translation of the First Office Action from the State Intellectual Property Office of the People's Republic of China dated Mar. 1, 2012.

\* cited by examiner

ETCHING CHAMBER HAVING FLOW EQUALIZER AND LOWER LINER

CROSS-REFERENCE TO RELATED APPLICATIONS

This application is a continuation of U.S. patent application Ser. No. 12/020,696, filed Jan. 28, 2008 now abandoned which is herein incorporated by reference.

BACKGROUND

1. Field

Embodiments of the present invention generally relate to a plasma processing chamber having a lowered flow equalizer and a lower chamber liner.

2. Description of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and the like.

As these critical dimensions shrink, process uniformity across the substrate becomes paramount to maintain high yields. One problem associated with a conventional plasma etch process used in the manufacture of integrated circuits is the non-uniformity of the etch rate across the substrate, which may be due, in part, to a vacuum pump drawing the etching gas toward the exhaust port and away from the substrate. As gases are more easily pumped from areas of the chamber that are closest to the exhaust port (i.e., the periphery of the substrate), the etching gas is pulled toward the exhaust port and away from the substrate, thereby creating a non-uniform etch on the substrate positioned therein. This non-uniformity may significantly affect performance and increase the cost of fabricating integrated circuits.

Therefore, there is a need in the art for an apparatus for uniformly etching material layers during the manufacture of integrated circuits.

SUMMARY

Aspects of the present invention generally pertain to a plasma processing chamber having a lowered flow equalizer and a lower chamber liner. In one embodiment, a plasma apparatus comprises a chamber body, a first chamber liner disposed within the chamber body, a second chamber liner disposed within the chamber body below the first chamber liner, and a flow equalizer disposed within the chamber body and electrically coupled to both the first chamber liner and the second chamber liner.

In another embodiment, an etching apparatus comprises a chamber body, a substrate support pedestal disposed in the chamber body, a gas introduction showerhead disposed opposite to the substrate support, a first chamber liner disposed in the chamber body such that the substrate support pedestal, the gas introduction showerhead, and the first chamber liner at least partially enclose a processing area. An annular baffle is coupled to the substrate support pedestal and at least partially surrounding the substrate support pedestal. A second chamber liner is coupled to the chamber body and disposed below the first chamber liner. And, a flow equalizer disposed below the baffle and electrically coupled to both the first chamber liner and the second chamber liner.

In another embodiment, an etching apparatus comprises a chamber body, a substrate support pedestal disposed in the chamber body, a gas introduction showerhead disposed opposite to the substrate support, a first chamber liner disposed in the chamber body such that the substrate support pedestal, the gas introduction showerhead, and the first chamber liner at least partially enclose a processing area. The first chamber liner has a first annular notch cut into the bottom surface and a first electrically conductive ring is disposed within the first annular notch. An annular baffle is coupled to the substrate support pedestal and at least partially surrounding the substrate support pedestal. A second chamber liner is coupled to the chamber body and disposed below the first chamber liner, wherein the second chamber liner comprises a second annular notch cut into the bottom surface and a second electrically conductive ring is disposed within the second annular notch. A flow equalizer is disposed below the baffle and electrically coupled to both the first chamber liner and the second chamber liner, where the flow equalizer is coupled to the first annular ring and the second annular ring. The flow equalizer has an opening therethrough, wherein the center of the opening is offset from the center of the flow equalizer, and wherein a width of the flow equalizer gradually decreases from a first point to a second point disposed 180 degrees radially from the first point.

BRIEF DESCRIPTION OF THE DRAWINGS

So that the manner in which the above recited features of the present invention can be understood in detail, a more particular description of the embodiments of the present invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally comprise a plasma processing chamber having a lowered flow equalizer and a lower chamber liner. Various embodiments of the present invention will be described below in relation to an etching chamber. However, a variety of plasma deposition and etching chambers may benefit from the teachings disclosed herein, and in particular, dielectric etching chambers such as the ENABLER® etch chamber, which may be part of a semiconductor wafer processing system such as the CENTURA® system, the PRODUCER® etch chamber, the eMax® etch chamber, among others, all of which are available from Applied Materials, Inc. of Santa Clara, Calif. It is contemplated that other plasma reactors, including those from other manufacturers, may be adapted to benefit from the invention.

Figure 1:
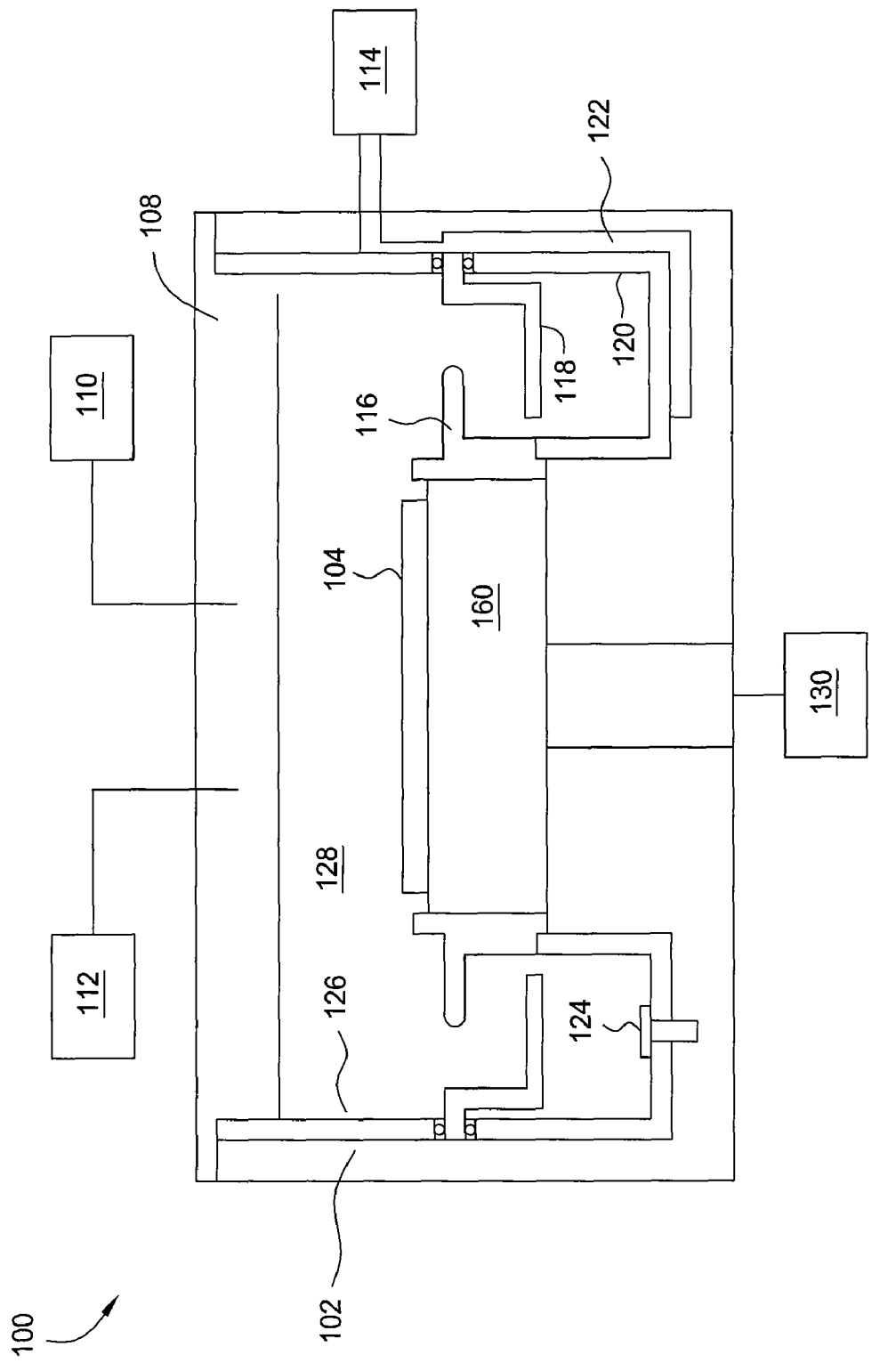
FIG. 1 is a schematic cross sectional view of an etching apparatus according to one embodiment of the invention.

FIG. 1 is a schematic cross sectional view of an etching apparatus 100 according to one embodiment of the invention. The apparatus 100 comprises a chamber body 102 in which a substrate 104 may be disposed on a pedestal 106 opposite a gas introduction showerhead 108. Processing gas may be supplied to the chamber 102 through the showerhead 108 from a gas source 110. In one embodiment, the pedestal 106 may be biased with current from a power source 130. In another embodiment, the showerhead 108 may be biased with a current from a power source 112.

During processing, the processing gas is supplied through the showerhead 108 into the processing area 128 where the processing gas, in plasma form, proceeds to etch material from the substrate 104. The plasma may extend not only to the substrate 104, but also to the chamber walls. To protect the chamber walls from the plasma, an upper liner 126 may be present. The upper liner 126 may protect the chamber walls from exposure to the plasma. Additionally, the upper liner 126 may be removed during processing downtime to be cleaned or replaced.

A lowered baffle 116 may surround the substrate 104 and the pedestal 106. The lowered baffle 116 may extend close to the upper liner 126 and have a plurality of slots therethrough. The slots in the baffle 116 permit processing gas to be drawn therethrough to be evacuated out of the processing chamber body 102. The slots may be sized to eliminate or reduce the amount of plasma that passes through the baffle 116.

Processing gas may also be drawn around the baffle 116 in the area between the baffle 116 and the upper liner 126. Generally, most of the plasma will be confined to the processing area 128, but some plasma may extend out beyond the outer reaches of the baffle 116 and thus be pulled below the baffle 116. Thus, a lower chamber liner 120 may be present to protect the lower chamber walls from the plasma. The lower liner 120 may be removed during processing downtime to be cleaned or replaced. The lower liner 120 may be coupled to the bottom of the chamber body 102 by a countersunk fastening mechanism 124. In one embodiment, the fastening mechanism 124 may comprise a screw.

A vacuum pump 114 may evacuate the processing chamber body 102 and thus pull processing gases through the baffle 116 and through the area between the baffle 116 and the upper liner 126. One or more plenums 122 may be present between the lower liner 120 and the side of the chamber body 102 and the bottom of the chamber body 102. The one or more plenums 122 function to broaden out the vacuum draw. The one or more plenums 122 may be present along only a portion of the lower liner 120. Thus, the greatest draw of the vacuum will be in the area closest to the plenum 122, which is closest to the vacuum pump 114 as opposed to an area furthest away from the plenum 122 and vacuum pump 114.

A flow equalizer 118 may be present to even out the vacuum draw from the processing area 128. The flow equalizer 118 may be coupled between the upper liner 126 and the lower liner 120 and extend under a portion of the baffle 116. The flow equalizer 118 may have an opening therethrough so that the flow equalizer 118 may fit around the pedestal 106. The width of the baffle 116 is greater than the diameter of the opening of the flow equalizer 118. The flow equalizer 118 extends under the baffle 116. The flow equalizer 118 extends a greater distance under the baffle 116 at the location closest to the plenum 122. The distance that the flow equalizer 118 extends under the baffle 116 gradually decreases along a 180 degree radius around the pedestal 106.

By gradually decreasing the distance that the flow equalizer 118 extends under the baffle 116, the vacuum draw from the processing area 128 may be substantially even along the entire periphery of the substrate 104. The flow equalizer 118 extends under the baffler 116 the greatest at the location closest to the vacuum pump 14 and the one or more plenums 122, where the pull from the vacuum pump 114 is greatest. Similarly, the flow equalizer 118 extends under the baffler 116 the least at the location farthest from the vacuum pump 14 and the one or more plenums 122, where the pull from the vacuum pump 114 is the least. By gradually decreasing the distance that the flow equalizer 118 extends under the baffle 116, the vacuum draw from the processing area 128 may be substantially even. An even vacuum draw from the processing area 128 may aid in uniform etching of the substrate 104.

Figure 2:
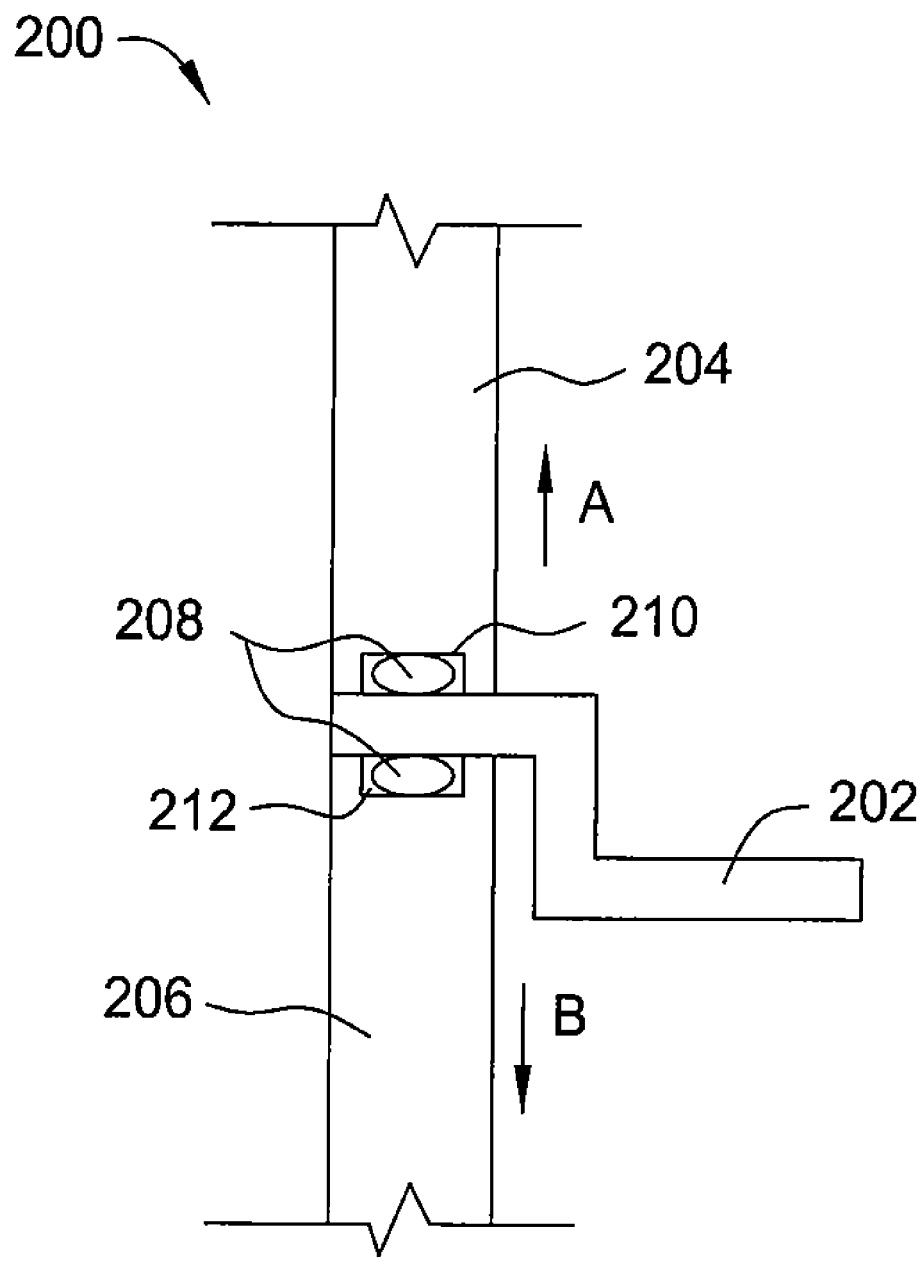
FIG. 2 is a schematic cross sectional view of the coupling between the upper liner, lower liner, and flow equalizer.

FIG. 2 is a schematic cross sectional view of the coupling 200 between the upper liner 204, lower liner 206, and flow equalizer 202. The flow equalizer 202 is coupled between the upper liner 204 and the lower liner 206. The upper liner 204 has an annular notch 210 cut therein. Within the notch 210, an electrically conductive material 208 may be disposed to ensure good electrical contact between the upper liner 204 and the flow equalizer 202. Similarly, the lower liner 206 may have an annular notch 212 cut therein. Within the notch 212, an electrically conductive material 208 may be disposed to ensure good electrical contact between the lower liner 206 and the flow equalizer 202. In one embodiment, the electrically conductive material 208 may comprise copper. In another embodiment, the electrically conductive material 208 may comprise nickel.

Because the flow equalizer 202 is electrically coupled to the upper liner 204 and lower liner 206, the flow equalizer 202 is grounded with the liners 204, 206. Thus, when an RF plasma is present, the RF current seeking a return path to ground may travel along the flow equalizer 202 and up the upper liner 204 as shown by arrow "A" or down the lower liner 206 as shown by arrow "B". RF current in the chamber will travel the easiest path to ground. By electrically coupling the flow equalizer 202 to the liners 204, 206, the flow equalizer 202 will be at the same electrical potential as the liners 204, 206 and provide the same path to ground. The flow equalizer 202, by being electrically coupled to the liners 204, 206, increases the surface area of the path to ground through the liners 204, 206 and hence, may cause the plasma to extend more uniformly over the substrate in the chamber. If the flow equalizer 202 were electrically floating or grounded to the pedestal, the flow equalizer may actually pull the plasma and create either an edge high etching plasma or a center high etching plasma (depending upon where it is coupled) and thus contribute to uneven etching.

Figure 3A:
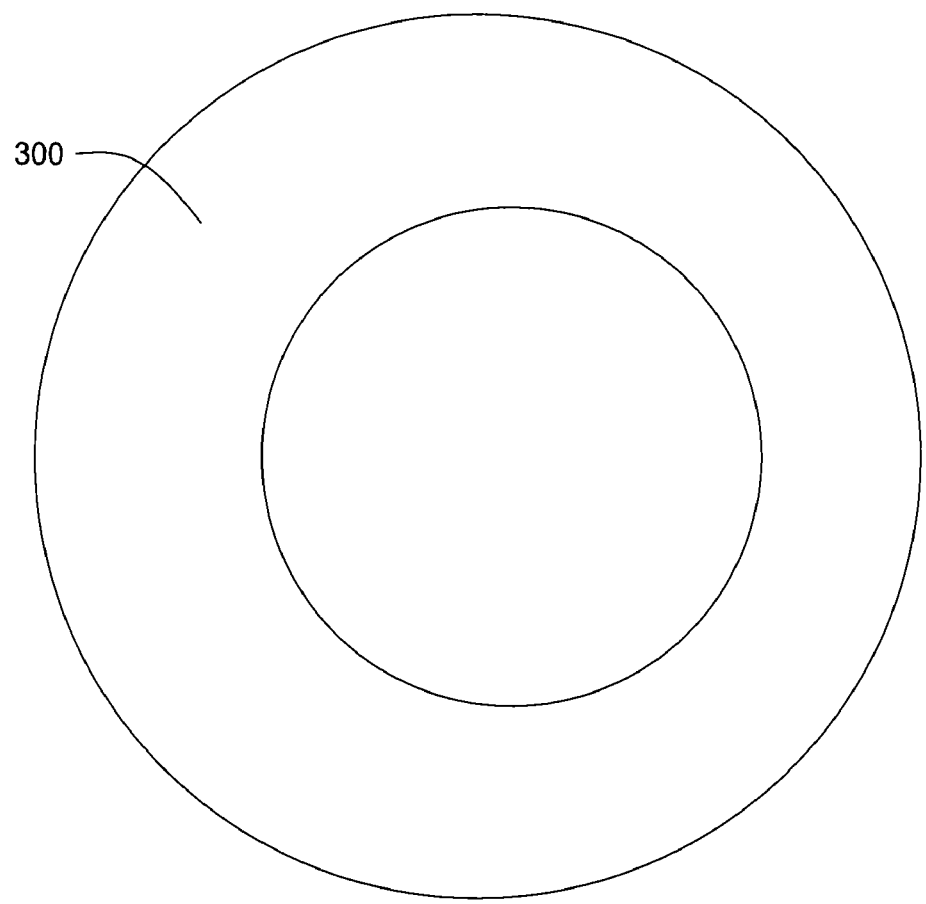
FIG. 3A is a schematic top view of a flow equalizer according to another embodiment of the invention.
Figure 3B:
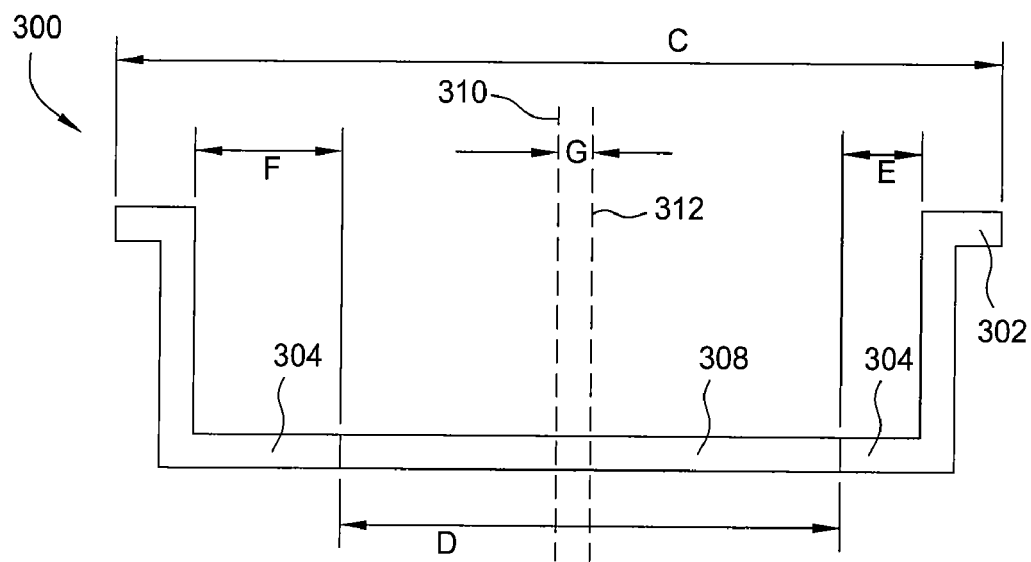
FIG. 3B is a schematic cross sectional view of the flow equalizer of FIG. 3A.

FIG. 3A is a schematic top view of a flow equalizer 300 according to another embodiment of the invention. FIG. 3B is a schematic cross sectional view of the flow equalizer 300 of FIG. 3A. The flow equalizer 300 has a ledge 302 which rests on the lower chamber liner and is the electrical coupling point for the flow equalizer 300 to the lower liner and the upper liner in an etching chamber. The flow equalizer 300 has a hole 308 therethrough that has a center line 312 that is offset from the center line 310 of the flow equalizer 300 by a distance shown by arrows "G". In one embodiment, the offset may be between about 0.75 to about 1.25 inches. In another embodiment, the offset may be between about 0.90 to about 1.10 inches. The off-center hole 308 permits the flange 304 of the flow equalizer 304 to gradually decrease in width along a 180 degree radius. The flange 304 is disposed at a location below the ledge 302 such that the flange 304 will reside below the baffle in the etching chamber.

Figure 4A:
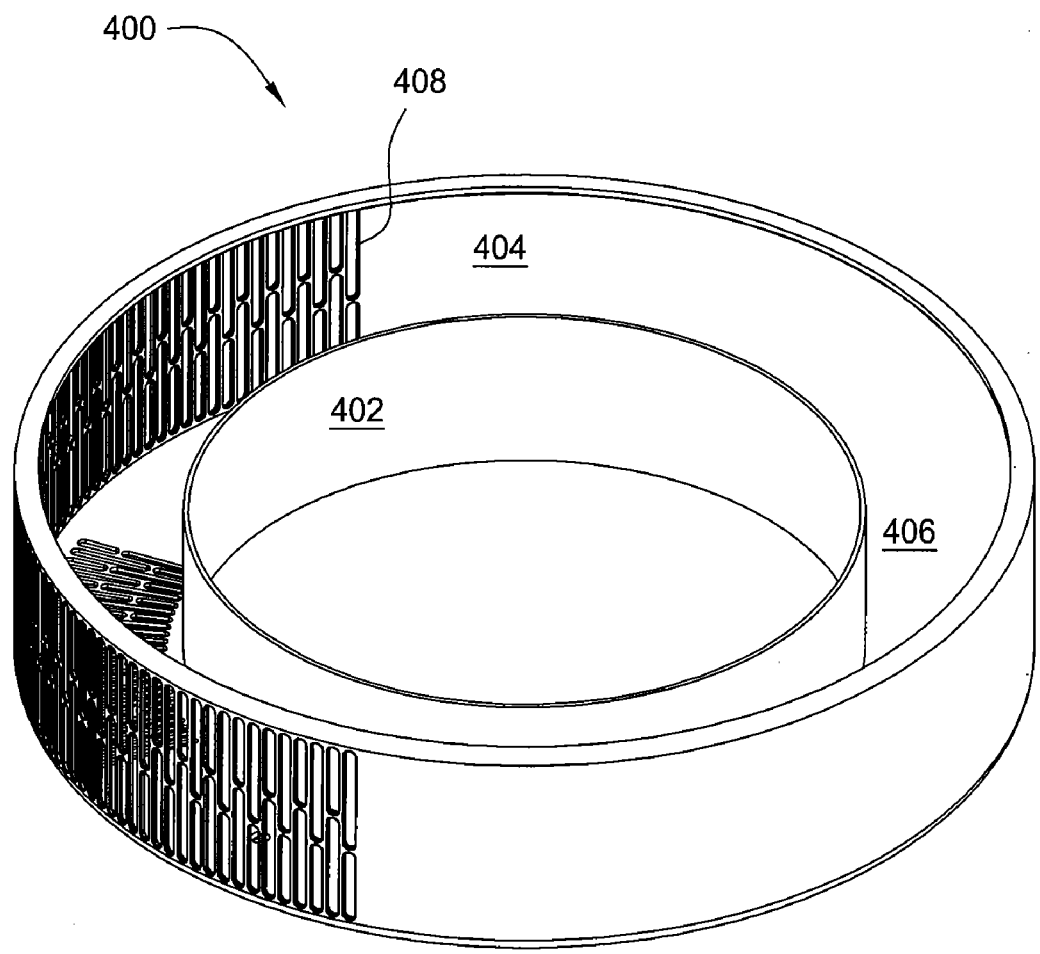
FIG. 4A is a schematic isometric view of a lower liner according to one embodiment of the invention.

FIG. 4A is a schematic isometric view of a lower liner 400 according to one embodiment of the invention. The lower liner 400 comprises an inner wall 402 that extends up from the bottom wall 406. The inner wall 402 protects the area under the pedestal from any plasma exposure. The outer wall 404 protects the chamber walls below the upper liner from plasma exposure. Within the outer wall 404 and the bottom wall 406, one or more gas passages 408 may be carved therethrough. In one embodiment, the gas passages 408 may be staggered along the outer wall 404 and bottom wall 406. In another embodiment, the gas passages may be substantially identical and arranged across the outer wall 404 and the bottom wall 406.

The gas passages 408 in the outer wall 404 may extend around the outer wall 404 for only a portion corresponding to the plenum in the chamber. If the plenum extends around the entire lower liner 400, then the gas passages 408 could extend around the entire outer wall 404. In one embodiment, the gas passages 408 may be present on the outer wall 404 for an area of less than about 50 percent. Similarly, the gas passages in the bottom wall 406 may extend around the bottom wall 406 for only a portion corresponding to the plenum in the chamber. If the plenum extends around the entire bottom, then the gas passages 408 could be present along the entire bottom wall 406.

Although the majority of the plasma (i.e., about 99 percent) may be contained above the baffle in the chamber, it is possible that some plasma may be pulled below the pedestal, baffle, and flow equalizer. To reduce the likelihood of plasma from being drawn into the plenum, the vacuum lines, or the vacuum pumps, the gas passages 408 may be sized such as to prevent plasma from passing therethrough.

Figure 4B:
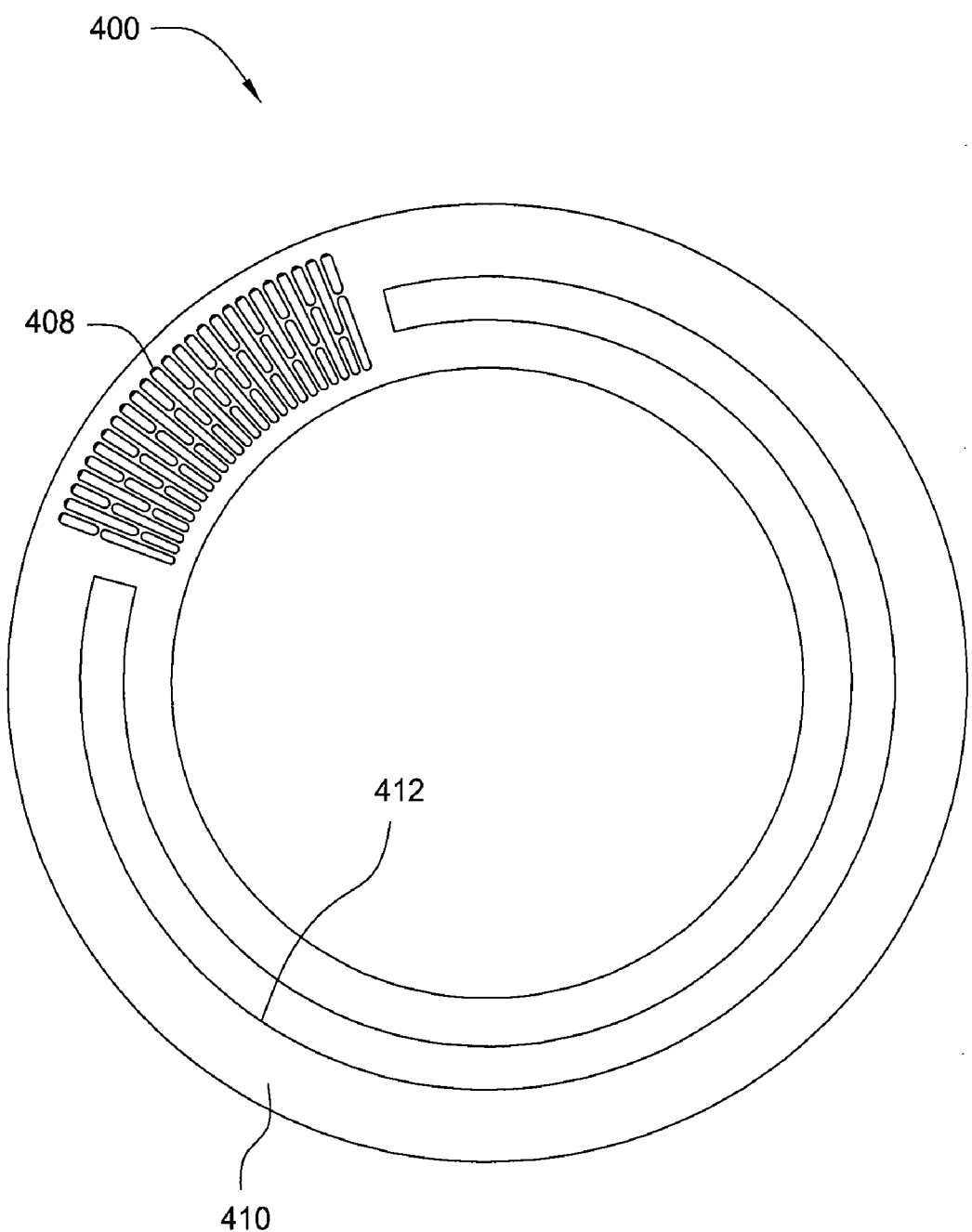
FIG. 4B is a schematic bottom view of the lower liner of FIG. 4A.

FIG. 4B is a schematic bottom view of the lower liner 400 of FIG. 4A. As shown in FIG. 4B, the gas passages 408 in the bottom wall 406 may extend only part of the way around the liner 400. In one embodiment, the gas passages 408 may be present in less than about 25 percent of the bottom wall 406. The bottom surface 410 of the bottom wall 406 may have an electrically conductive material 412 disposed therein to electrically couple the lower liner 400 to ground. In one embodiment, the electrically conductive material 412 comprises nickel. In one embodiment, the electrically conductive material 412 may extend about 270 degrees radially around the bottom surface 410 of the lower liner 400.

Figure 4C:
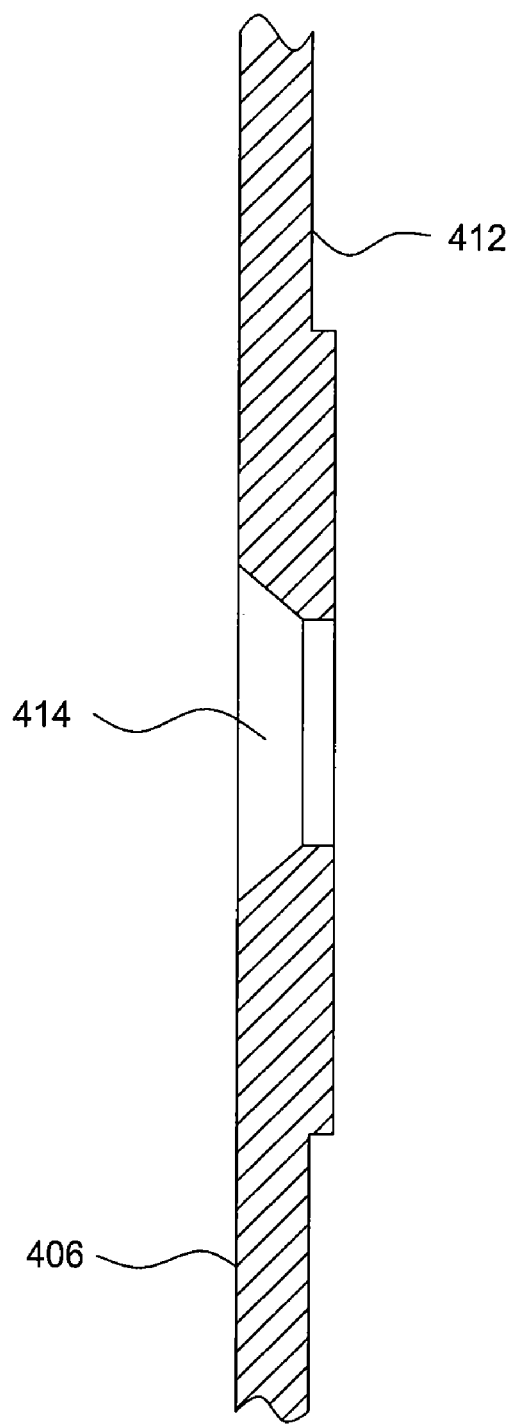
FIG. 4C is a schematic cross sectional view of a coupling location of the lower liner of FIG. 4A.

FIG. 4C is a schematic cross sectional view of a coupling location of the lower liner 400 of FIG. 4A. The coupling may comprise a countersunk fastening location 414. By utilizing a countersunk fastening location 414 as opposed to a straight passage, the lower liner 400 may be securely fastened to the chamber body such that any movement of the lower liner 400 due to expansion and contraction or jostling of the chamber may be kept to a minimum.

By grounding the flow equalizer to both a lower chamber liner and an upper chamber liner, the flow equalizer may provide a path to ground through the liners and thus, even out the plasma distribution within the processing area of the chamber. By evening out the plasma distribution, etching uniformity may be increased.

While the foregoing is directed to embodiments of the present invention, other and further embodiments of the invention may be devised without departing from the basic scope thereof, and the scope thereof is determined by the claims that follow.

The invention claimed is:

1. A multi-part liner for a processing chamber, comprising:
a lower chamber liner comprising a bottom wall coupled to an inner sidewall and an outer sidewall;
an upper chamber liner disposed above the lower chamber liner;
an annular baffle disposed above the inner sidewall of the lower chamber liner; and
a flow equalizer connecting both the lower chamber liner and the upper chamber liner, wherein the flow equalizer comprises:
a ledge portion; and
a flange portion coupled to the ledge portion and extending radially inwards from the ledge portion, the flange portion defining a central opening through the flow equalizer, the central opening having a center that is offset from the center of the flow equalizer, wherein the flange portion extends a greater distance under the baffle at a first location along the flange compared to a second location along the flange,
wherein the upper liner, the lower liner, and the flow equalizer are electrically coupled together.

2. The multi-part liner of claim 1, wherein the upper chamber liner has a first annular notch cut into the bottom surface of the upper chamber liner and the lower chamber liner comprises a second annular notch cut into the top surface of the lower chamber liner.

3. The multi-part liner for a processing chamber of claim 1, wherein the inner sidewall and outer sidewall are substantially annular.

4. The multi-part liner for a processing chamber of claim 1, wherein the distance the flange portion extends under the baffle gradually decreases along a 180 degree radius around the flange.

5. The multi-part liner for a processing chamber of claim 1, wherein the diameter of the annular baffle is greater than the diameter of the central opening of the flow equalizer.

6. The multi-part liner for a processing chamber of claim 1, wherein the inner sidewall extends to a first height and the outer sidewall extends to a second height different than the first height.

7. The multi-part liner for a processing chamber of claim 1, wherein the bottom wall and the outer sidewall each have a plurality of gas passages therethrough, wherein at least two gas passages of the outer sidewall have different dimensions, and wherein at least two gas passages of the bottom wall have different dimensions.

8. The multi-part liner for a processing chamber of claim 7, wherein the at least two gas passages of the outer sidewall have a substantially identical width.

9. The multi-part liner for a processing chamber of claim 7, wherein the at least two gas passages of the bottom wall have a substantially identical width.

10. The liner of claim 7, wherein the at least two gas passages of the outer sidewall have different lengths.

11. The liner of claim 7, wherein the at least two gas passages of the bottom wall have different lengths.

12. The multi-part liner for a processing chamber of claim 7, wherein the inner sidewall has no gas passages disposed therethrough.

13. The multi-part liner for a processing chamber of claim 7, wherein the gas passages occupy an area of less than about 50 percent of the outer wall.

* * * * *